United States Patent
Köhler et al.

(10) Patent No.: US 8,987,011 B2
(45) Date of Patent: Mar. 24, 2015

(54) METHOD FOR DETERMINING THE STRUCTURE OF A TRANSISTOR

(75) Inventors: Klaus Köhler, Freiburg (DE); Stefan Müller, Freiburg (DE); Patrick Waltereit, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 246 days.

(21) Appl. No.: 13/391,916

(22) PCT Filed: Aug. 18, 2010

(86) PCT No.: PCT/EP2010/062008
§ 371 (c)(1),
(2), (4) Date: Mar. 13, 2012

(87) PCT Pub. No.: WO2011/023607
PCT Pub. Date: Mar. 3, 2011

(65) Prior Publication Data
US 2012/0161150 A1 Jun. 28, 2012

(30) Foreign Application Priority Data
Aug. 26, 2009 (DE) .................. 10 2009 028 918

(51) Int. Cl.
*H01L 27/088* (2006.01)
*H01L 29/66* (2006.01)
(Continued)

(52) U.S. Cl.
CPC ....... *H01L 29/66462* (2013.01); *H01L 29/2003* (2013.01); *H01L 29/7787* (2013.01)
USPC .............................. 438/17; 438/10

(58) Field of Classification Search
CPC ................ H01L 29/66431; H01L 22/14
USPC ....................................... 438/10, 17
See application file for complete search history.

(56) References Cited

U.S. PATENT DOCUMENTS 5,296,395 A * 3/1994 Khan et al. ............. 438/149
5,639,343 A * 6/1997 Dobkin .................. 438/17
(Continued)

FOREIGN PATENT DOCUMENTS

DE  10 2004 055 038 A1  7/2005
JP  2005/086171  3/2005
(Continued)

OTHER PUBLICATIONS

Sze, S.M., Kwok, K.Ng., "Physics of Semiconductor Devices," Third Edition, Chp. 3, pp. 135-181, Oct. 2006, © 2007 John Wiley & Sons, Inc., Hoboken, New Jersey.
(Continued)

*Primary Examiner* — Matthew W Such
*Assistant Examiner* — Ali Naraghi
(74) *Attorney, Agent, or Firm* — Brinks Gilson & Lione

(57) ABSTRACT

A method for determining the structure of a transistor having at least one first layer including GaN, one second layer including $Al_xGa_{1-x}N$ disposed on the first layer, and one fourth layer including a metal or an alloy disposed on the second layer. The method includes setting the layer thickness of the second layer, setting the aluminum content x of the second layer, producing at least the second layer and the first layer, determining the surface potential of formula (I) and/or the charge carrier density n, and/or the charge carrier motility μ after producing the second layer and the first layer, and selecting the material of the fourth layer as a function of the at least one measurement result.

24 Claims, 5 Drawing Sheets

(51) Int. Cl.
*H01L 29/778* (2006.01)
*H01L 29/20* (2006.01)

(56) References Cited

U.S. PATENT DOCUMENTS

| | | | |
|---|---|---|---|
| 6,130,446 A * | 10/2000 | Takeuchi et al. | 257/99 |
| 7,224,004 B2 | 5/2007 | Kikkawa | 257/194 |
| 7,304,330 B2 | 12/2007 | Nakagawa | |
| 7,512,499 B1 * | 3/2009 | Bu et al. | 702/23 |
| 7,601,573 B2 | 10/2009 | Nakagawa | |
| 2005/0059197 A1 | 3/2005 | Yamashita et al. | |
| 2005/0193013 A1 * | 9/2005 | Yamashita et al. | 707/104.1 |
| 2007/0018199 A1 | 1/2007 | Sheppard et al. | |
| 2007/0176204 A1 * | 8/2007 | Murata et al. | 257/192 |
| 2007/0295990 A1 | 12/2007 | Higashiwaki | |
| 2008/0067546 A1 | 3/2008 | Murata et al. | |
| 2008/0079023 A1 * | 4/2008 | Hikita et al. | 257/192 |
| 2009/0173968 A1 | 7/2009 | Matsunaga et al. | |
| 2010/0283083 A1 * | 11/2010 | Niiyama et al. | 257/192 |
| 2013/0252386 A1 | 9/2013 | Sheppard et al. | |

FOREIGN PATENT DOCUMENTS

| | | |
|---|---|---|
| JP | 2005/136001 | 5/2005 |
| JP | 2007/207820 | 8/2007 |
| JP | 2009/503815 | 1/2009 |

OTHER PUBLICATIONS

Ambacher, O. et al., Pyroelectric Properties of Al(In)GaN/GaN hetero- and Quantum Well Structures, 2002, pp. 3399-3434, IOP Publishing Ltd.

Mori, T. et al., Schottky Barriers and Contact Resistances on P-type GaN, 1996, pp. 3537-3539, American Institute of Physics.

Sze, S.M., et al., Physics of Semiconductor Devices, 2007, pp. 1-25, John Wiley & Sons, Inc., Hoboken, New Jersey.

Parker, E.H.C., The Technology and Physics of Molecular Beam Epitaxy, 1985, pp. 183-231, Plenum Press, New York and London.

Wu, Y.-F. et al., High Power AlGaN/GaN HEMTs for Microwave Applications, 1997, pp. 1569-1574, Elsevier Science Ltd.

Shur, M.S., GaN Based Transistors for High Power Applications, 1998, pp. 2131-2138, Elsevier Science Ltd.

Morkoc, Hadis et al., GaN-based Modulation Doped FETs and UV Detectors, 2002, pp. 157-202, Elsevier Science Ltd.

Kiefer, R. et al., Development of a 2'—AlGaN/GaN HEMT technology on sapphire and SiC for mm-wave high-voltage Power Applications, 2003, pp. 191-194, Wiley-VCH Verlag GmbH & Co. KGaA, Weinheim.

Ambacher, O. et al., Two Dimensional Electron Gases Induced by Spontaneous and Piezoelectric Polarization in Undoped and Doped AlGaN/GaN Heterostructures, Jan. 1, 2000, pp. 334-344, vol. 87, No. 1, American Institute of Physics.

Köhler, K. et al., Growth and Electrical Properties of $Al_xGa_{1-x}N$/GaN Heterostructures with Different Al-Content, 2009, pp. 2652-2657, Wiley-VCH Verlag GmbH & Co. KGaA, Weinheim.

Dang, X.Z. et al., Measurement of Drift Mobility in AlGaN/GaN Heterostructure Field-Effect Transistor, Jun. 21, 1999, pp. 3890-3892, vol. 74, No. 25, American Institute of Physics.

Li, Miao et al., 2-D Analytical Model for Current-Voltage Characteristics and Transconductance of AlGaN/GaN MODFETs, Jan. 2008, pp. 261-267, vol. 55, No. 1, IEEE.

Dietrich, Ron, AlGaN/GaN HEMTs für HF-Leistungsanwendungen, 2002, pp. 1-208, Shaker Verlag.

Waltereit, P. et al., High-Efficiency GaN HEMTs on 3-inch Semi-Insulating SiC Substrates, 2008, pp. 1078-1080, Wiley-VCH Verlag GmbH & Co. KGaA, Weinheim.

Schmitz, A.C. et al., Metal Contacts to N-Type GaN, 1998, pp. 255-260, vol. 27, No. 4, Journal of Electronic Materials.

Kuech, T.F. et al., The Control and Modeling of Doping Profiles and Transients in MOVPE Growth, 1988, pp. 624-630, Elsevier Science Publishers B.V.

Jeong, Jae Kyeong et al., Influence of Al Doping on Lattice Strain and Electrical Properties of Epitaxial GaN Films Grown by Metalorganic Chemical Vapor Deposition on $Al_2O_3$ Substrate, Apr. 5, 2004, pp. 2575-2577, vol. 84, No. 14, American Institute of Physics.

Köhler, K. et al., The Surface Potential of GaN:Si, 2008, pp. 1-5, American Institute of Physics.

Köhler, K. et al., Determination of the Surface Potential of GaN:Si, 2009, pp. S937-S939, Wiley-VCH Verlag GmbH & Co. KGaA, Weinheim.

Zhang, Yifei, et al., Charge Control and Mobility in AlGaN/GaN Transistors: Experimental and Theoretical Studies, Jun. 1, 2000, pp. 7981-7987, vol. 87, No. 11, American Institute of Physics.

Japanese Office Action, dated Dec. 3, 2013, pp. 1-2, Japanese Patent Application No. 2012-526007, Japan Patent Office.

* cited by examiner

METHOD FOR DETERMINING THE STRUCTURE OF A TRANSISTOR

BACKGROUND

The invention relates to a method for determining the structure of a transistor which comprises at least a first layer, a second layer and a fourth layer, wherein the fourth layer is arranged on the second layer and the second layer is arranged on the first layer, the first layer comprises GaN, the second layer comprises $Al_xGa_{1-x}N$ and the fourth layer comprises a metal or an alloy. The invention also relates to a semiconductor element which comprises a transistor.

U.S. Pat. No. 7,224,004 B2 discloses a transistor of the type cited at the outset. This transistor has at least a first and a third layer which comprise GaN. Arranged in between these is a second layer which comprises AlGaN. On account of the various lattice constants, mechanical tensions are produced within the semiconductor structure which cause piezoelectric polarization. This produces band bending at the interface between the first and second layers, and a two-dimensional electron gas is produced at said band bending. This can produce a zone of increased electrical conductivity within the transistor, without having to introduce dopants into the material. By applying an electrical voltage to a fourth layer, comprising a metal, that has been applied to the third layer, it is possible to influence the charge carrier density during operation of the transistor.

Transistors of the type cited at the outset are used particularly as power amplifiers for radio-frequency signals, for example signals at a frequency of more than 0.9 GHz. Such transistors can be fabricated by means of metalorganic vapor phase epitaxy or molecular beam epitaxy, for example.

The charge carrier density of the two-dimensional electron gas (2-DEG) influences the layer resistance within the 2-DEG and also the threshold value of the gate voltage of a transistor comprising said semiconductor structure, from which the flow of current within the 2-DEG starts. In addition, the threshold voltage is influenced by the surface potential of the semiconductor structure, the thickness thereof and the magnitude of the band bending which occurs at the interface. O. Ambacher et al.: Pyroelectric properties of AlGaN/GaN hetero- an quantum-well structures, J. Phys.: Condens. Matter 14 (2002) 3399 discloses an approximation formula which can be used to model the charge carrier concentration within the two-dimensional electron gas as a function of the aluminum content of the second layer.

The technical application of the transistors cited at the outset requires the provision of such a transistor having a prescribable threshold voltage $U_{th}$ and having a prescribable layer resistance. It is therefore an object of the present invention to specify a method for determining the structure of a transistor which has a prescribable threshold voltage $U_{th}$ and/or a prescribable charge carrier density $n_s$.

SUMMARY

The threshold voltage $U_{th}$ of a transistor of the type cited at the outset and the layer resistance thereof can be set using three degrees of freedom, namely the layer thickness and the aluminum content of the second layer and the metal used for the gate contact. According to the invention, it has been recognized that an alteration in the layer thickness cannot be compensated for by an alteration in the aluminum content. This opens up the opportunity to vary the layer thickness and the aluminum content in order to provide a transistor having prescribable properties, particularly having a prescribable charge carrier concentration $n_s$ and threshold voltage $U_{th}$.

It has also been recognized in accordance with the invention that the charge carrier concentration is dependent on the surface potential of the outermost layer. Therefore, measuring the charge carrier concentration $n_s$, for example using a Hall effect measurement, results in a first value so long as the semiconductor structure is not yet provided with a gate metalization. Following the application of the gate metalization as a fourth layer, measurement of the charge carrier concentration $n_s$, for example using a Hall effect measurement, results in a second value, which is different than the first value. A reliable prediction of the second value, which is essential for the operation of the transistor, has not been possible to date. According to the invention, it has been recognized that the second value can be predicted from the first value if the surface potential is known.

The invention proposes determining the influence of the gate metalization on the charge carrier concentration and the threshold voltage by determining the potential difference between the Schottky barrier and the surface potential of the outermost layer of the semiconductor structure. To this end, the method according to the invention may comprise measurement of the surface potential of the outermost layer of the semiconductor structure. In other embodiments of the invention, the surface potential can be determined from comparison experiments which, by way of example, take account of the fabrication method and/or the ambient conditions of the semiconductor wafer at the time of the measurement and/or during a prescribable time frame prior to the measurement. This allows a transistor having prescribable properties to be provided by customizing the Schottky barrier by selecting the gate metalization, by selecting the layer thickness d of the second and/or third layer and also the aluminum content x of the second layer.

Totally surprisingly, it has been found that a transistor which has been optimized to such an extent has increased resistance toward a mismatch with subsequent components, which means that the failure rate of such a transistor or of an appliance equipped therewith decreases.

In some embodiments of the invention, the material of the fourth layer may be selected from silver and/or palladium and/or nickel and/or platinum. This allows the Schottky barrier and hence the threshold voltage and the charge carrier density of the transistor to be set within broad ranges. Thus, by way of example, the barrier height of the Schottky barrier for a silver contact is 0.5 eV, that for a palladium contact is 0.9 eV, that for a nickel contact is 1.0 eV and the Schottky barrier for a platinum contact is 1.1 eV.

In some embodiments of the invention, the total thickness d of the second and third layers can be chosen to be between approximately 15 nm and approximately 50 nm. In some embodiments of the invention, the aluminum content x of the second layer may be chosen to be between 0.08 and 0.18. In the parameter range indicated, it is possible to provide transistors which achieve a charge carrier density of between $2 \times 10^{12}$ and $9 \times 10^{12}$ cm$^{-2}$ and a threshold voltage $U_{th}$ of between 0 and −3 V.

BRIEF DESCRIPTION OF THE DRAWINGS

The invention will be explained in more detail below with reference to exemplary embodiments and figures without limiting the general inventive concept. In the figures.

DESCRIPTION OF PREFERRED EMBODIMENTS

Figure 1:
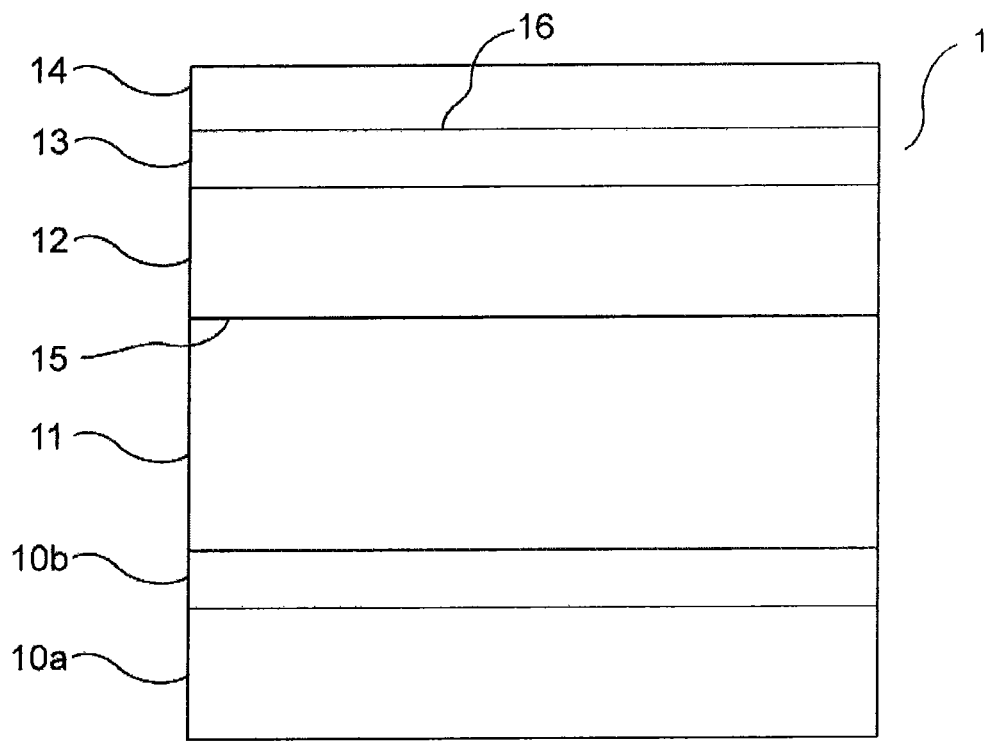
FIG. 1 shows a cross section through a transistor proposed according to the invention.

FIG. 1 shows a cross section through a transistor 1 according to the invention. The cross section shown in FIG. 1 is limited to the channel region of the transistor. The fabrication of adjoining source and drain regions is familiar to a person skilled in the art and is therefore not explained further in FIG. 1.

The transistor 1 is arranged on a substrate 10a. By way of example, the substrate 10a may comprise sapphire or silicon carbide. The substrate 10a may have an optional buffer layer 10b arranged on it. The buffer layer 10b may comprise AlN, for example. The buffer layer 10b may have a thickness of between 30 and 150 nm. The buffer layer 10b can be used to facilitate the nucleation of the first layer 11 situated above. Furthermore, the buffer layer 10b can bring about a prescribable electrical resistance between the first layer 11 and the substrate 10a.

The optional buffer layer 10b or the surface of the substrate 10a has the first layer 11 arranged on it. The first layer 11 comprises GaN. The first layer 11 may have a thickness of between 1 μm and 3 μm in some embodiments of the invention.

The first layer 11 has a second layer 12 arranged on it. The second layer 12 comprises $Al_xGa_{1-x}N$. In some embodiments of the invention, the aluminum content x may be chosen to be between 0.08 and 0.18. In other embodiments of the invention, the aluminum content x can also rise to x=0.3. In some embodiments of the invention, the second layer 12 may have a thickness of between 10 nm and 45 nm.

The second layer 12 may have an optional third layer 13 arranged on it. The third layer 13 may again comprise GaN or $Al_yGa_{1-y}N$. In this case, the aluminum content y is usually different than the aluminum content x of the second layer 12, y being able to be chosen to be between 0.05 and 0.30. The third layer 13 may have a thickness of between 2 nm and 10 nm. In some embodiments of the invention, the second layer 12 and the third layer 13 together have a thickness of between 15 nm and approximately 50 nm.

On account of the piezoelectric polarization of the first layer 11, of the second layer 12 and of the optional third layer 13, a two-dimensional electron gas (2-DEG) is produced at the interface 15 between the first layer 11 and the second layer 12. The charge carrier density $n_s$ may be determined by the aluminum content x in the second layer 12. Furthermore, the charge carrier density $n_s$ at the interface between the first layer 11 and the second layer 12 can be influenced by an influencing electrical field. Such an electrical field may be brought about by a surface potential on that surface 16 of the third layer 13 which is remote from the second layer 12, for example, or, in the absence of the third layer 13, by a surface potential on that surface of the second layer 12 which is remote from the first layer 11.

In order to bring about an electrical field which influences the charge carrier density $n_s$ during operation of the transistor 1, a fourth layer 14 comprising a metal or an alloy is applied to the surface 16 of the third layer or to the surface of the second layer 12. In some embodiments of the invention, the fourth layer 14 may have a layer thickness of between 2 nm and 30 nm. In some embodiments of the invention, the fourth layer comprises silver and/or palladium and/or nickel and/or platinum. The presence of the fourth layer 14 can influence the surface potential on the surface 16 of the outermost layer 13 or 12, as a result of which the presence of the fourth layer 14 also influences the charge carrier concentration at the interface 15 when there is no electrical voltage applied to the fourth layer. Furthermore, a prescribable electrical potential can be applied to the fourth layer 14 during operation of the transistor 1 in order to influence the charge carrier concentration by means of an electrical field in a prescribable manner.

Beyond the cited constituents, the buffer layer 10b, the first layer 11, the second layer 12, the third layer 13 and/or the fourth layer 14 may comprise further elements, either as a dopant, in order to set a particular prescribable conductivity for the buffer layer 10b, the first layer 11, the second layer 12, the third layer 13 and/or the fourth layer 14, or in order to influence the lattice constants of the buffer layer 10b, the first layer 11, the second layer 12, the third layer 13 and/or the fourth layer 14, or as inevitable impurities.

Figure 2:
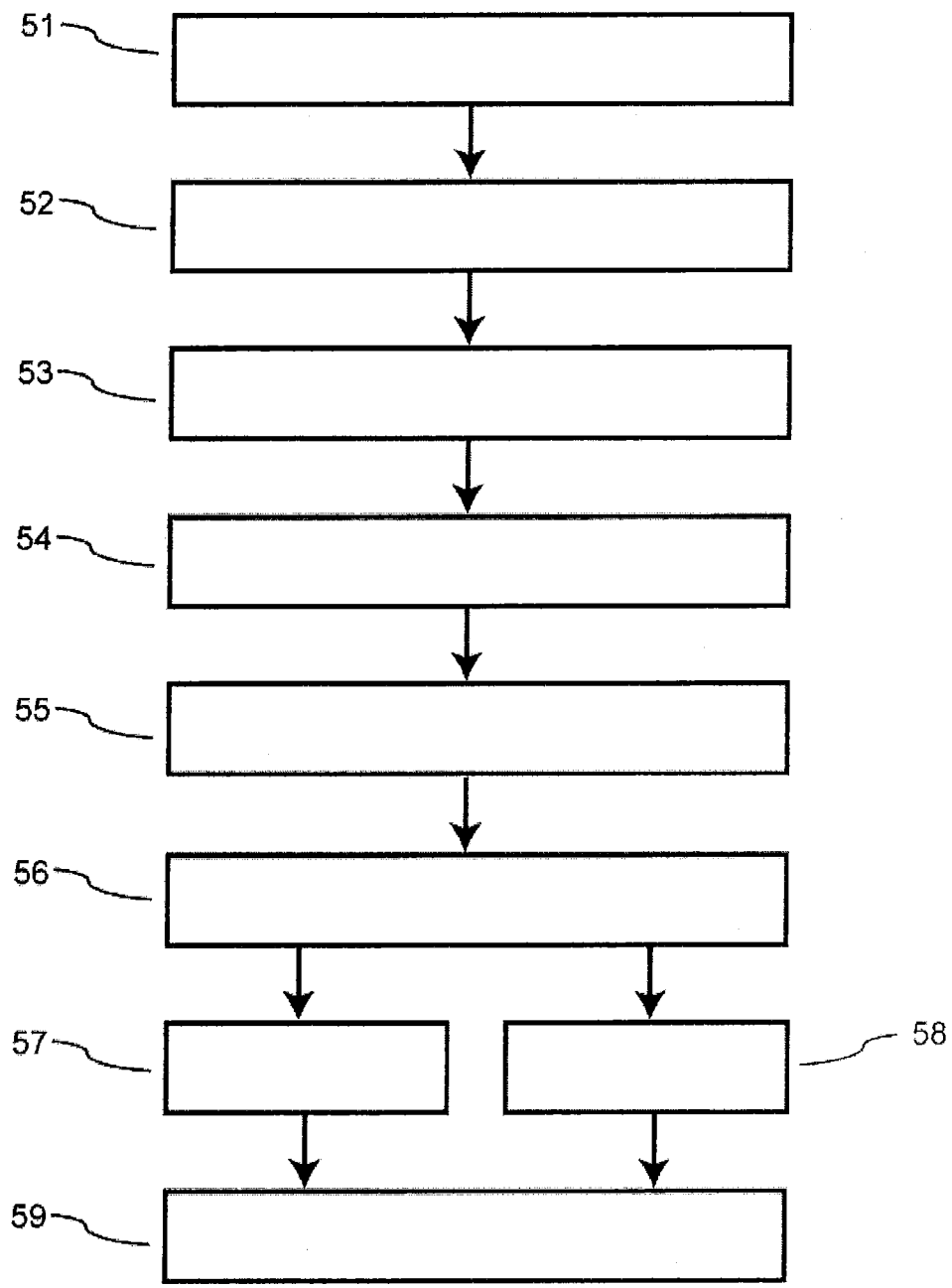
FIG. 2 shows a flowchart of the disclosed method.

FIG. 2 shows a flowchart of the method proposed according to the invention for determining the structure of at least one transistor 1. In the first method step 51, the layer thickness of the second layer 12 and the layer thickness of the optional third layer 13 are first of all stipulated, these having an influence on the charge carrier concentration $n_s$ at the interface 15 and on the threshold voltage $U_{th}$.

In the second method step 52, the aluminum content x of the second layer 12 is stipulated, as a result of which a prescribable charge carrier concentration $n_s$ and hence a prescribable layer resistance for the 2-DEG within the interface 15 are achieved.

In the third method step 53, at least the first layer 11, the second layer 12 and, if present, the third layer 13 are fabricated. In some embodiments of the invention, method step 53 may also comprise the fabrication of the buffer layer 10b on the substrate 10a as well. Said layers can be fabricated using molecular beam epitaxy, for example. In other embodiments of the invention, the layers can be deposited from an activated vapor phase, for example using MOCVD or MOVPE.

In the fourth method step 54, at least the charge carrier density $n_s$ and optionally the mobility μ of the 2-DEG is/are determined. This can be done using a Hall effect measurement in a manner which is known per se, for example. Since the charge carrier density is influenced by the surface potential of the surface 16 of the outermost layer 13, interpreting the results of the Hall effect measurement may require the surface potential $\Phi_B$ of the outermost layer, for example the third layer 13, to be measured too. This can be accomplished by photoreflection in a manner which is known per se, for example.

Since the surface potential $\Phi_B$ may be dependent on the fabrication method which was used in step 53 and/or on the aluminum content stipulated in step 52, the charge carrier density $n_s$ following the fabrication of the first layer 11, the second layer 12 and the third layer 13 may also be dependent on the fabrication method and/or on the aluminum content. In this case, the dependency of the charge carrier density $n_s$ on the aluminum content x results particularly from parasitic aluminum impurities which are incorporated into the third layer 13. It is therefore possible for the surface potential $\Phi_B$ or the influence thereof on the measured charge carrier density $n_s$ also to be ascertained by interpolating comparison experiments on semiconductor structures of the same kind.

In other embodiments of the invention, the determination of the surface potential and/or of the charge carrier density in the fourth method step 54 can also be effected by means of calculation and/or by resorting to tabulated measured values for semiconductor structures of the same kind. In this case, the charge carrier density and/or the surface potential for a multiplicity of transistors 1 of the same kind can be determined in a particularly simple manner.

In the fifth method step 55, a gate material is selected for the fourth layer 14. In particular, the material of the fourth layer may comprise silver and/or palladium and/or nickel and/or platinum. By selecting the material of the fourth layer 14, the surface potential at the interface between the outermost layer, for example the third layer 13, and the fourth layer 14 is confined to the barrier height of the respective Schottky barrier. In some embodiments of the invention, the Schottky barrier is 0.5 eV when the fourth layer comprises essentially silver. The Schottky barrier is 0.9 eV when the fourth layer comprises essentially palladium. In another embodiment of the invention, the Schottky barrier is 1.0 eV when the material of the fourth layer comprises essentially nickel. If the material of the fourth layer comprises essentially platinum, the Schottky barrier is 1.1 eV. Self-evidently, the material of the fourth layer is not limited to the cited materials. In some embodiments of the invention, it is also possible to use alloys or multilayer systems for the fourth layer 14.

In the sixth method step 56, it is now possible to determine the influence of the fourth layer on the charge carrier density $n_s$ of the 2-DEG. The charge carrier density $n_s$ is determined by the aluminum content x of the second layer, the thickness of the second layer 12 and of the third layer 13 and also the applied electrical field. Since the aluminum content x and the layer thicknesses d have already been stipulated in the first three method steps 51, 52 and 53, the sixth method step 56 now only needs to take account of the change $\Delta\Phi_B$ in the surface potential $\Phi_B$. This change $\Delta\Phi_B$ in the surface potential corresponds to the difference between the Schottky barrier from the selected gate metal and the surface potential of the outermost layer, as determined in method step 54. In this case, in some embodiments of the invention, the change in the charge carrier density $\Delta n_s$ can be modeled by the following equation:

$$\Delta\Phi_B = \frac{e^2 \cdot d}{\varepsilon \cdot \varepsilon_0} \Delta n_s.$$

In the subsequent method steps 57 and 58, the threshold voltage $U_{th}$ of the transistor 1 is determined. Usually, the single determination of the threshold voltage $U_{th}$ will suffice, so that either method step 57 or method step 58 is performed. In some embodiments of the invention, however, both method steps 57 and 58 can be performed for the purpose of plausibility checking or in order to increase the precision.

In method step 57, provision is made for the threshold voltage $U_{th}$ to be modeled on the basis of the surface potential $\Phi_B$ following the application of the fourth layer and the charge carrier density $n_s$ following the application of the fourth layer 14 in accordance with the following equation:

$$U_{th} = \frac{\Phi_B}{e} - \frac{\Delta E_c}{e} - \frac{e \cdot n_s \cdot d}{\varepsilon \cdot \varepsilon_0}.$$

In this case, e denotes the elementary charge, $\Delta E_c$ denotes the band bending at the interface 15, d denotes the layer thickness of the second layer 12 and of the third layer 13, and $\varepsilon$ and $\varepsilon_0$ denote the relative and vacuum permittivities.

In method step 58, a simplified method for ascertaining the threshold voltage $U_{th}$ of the transistor on the basis of the change in the surface potential $\Delta\Phi_B$ following the application of the fourth layer 14 can be carried out:

$$U_{th} = U_{th}^0 + \frac{2 \cdot \Delta\Phi_B}{e}.$$

In this case, e again denotes the elementary charge and $U_{th}^0$ denotes the threshold voltage calculated from the measured values ascertained in method step 54. $U_{th}^0$ can be ascertained in a manner which is known per se, for example as described in O. Ambacher et al.: Pyroelectric properties of AlGaN/GaN hetero- and quantum-well structures, J. Phys.: Condens. Matter 14 (2002) 3399.

If the values for the charge carrier concentration $n_s$ and the threshold voltage $U_{th}$ which have been ascertained in method step 56, 57 and/or 58 correspond to the desired target values, method step 59 may involve the gate material selected in method step 55 being applied as a fourth layer 14 to the surface of the outermost layer 12 or 13. If the ascertained values of the threshold voltage and of the charge carrier concentration differ from the desired target values, method steps 55, 56, 57 and/or 58 can be repeated until a gate material has been found which is able to provide the desired properties of the transistor.

Figure 3:
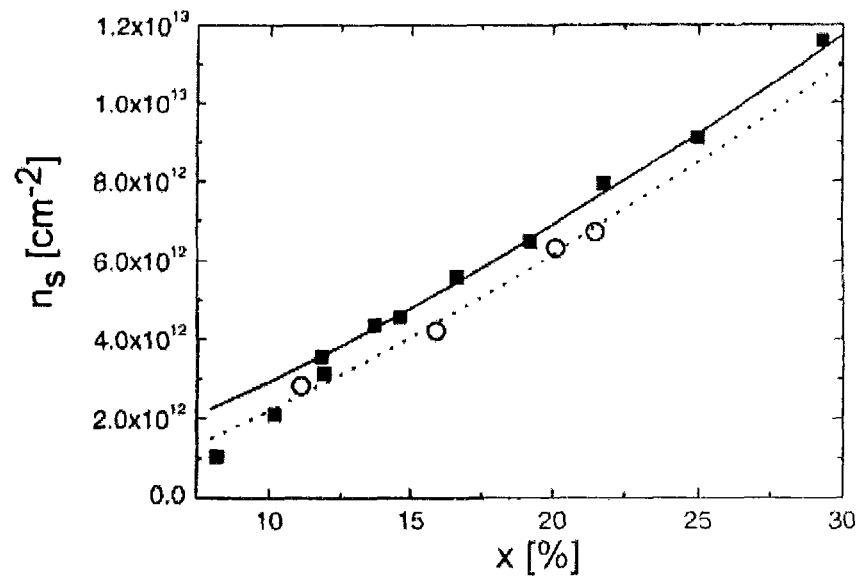
FIG. 3 illustrates the charge carrier density of a transistor proposed according to the invention as a function of the aluminum content of the second layer.

FIGS. 3, 4, 5, 6 and 9 show measured values which have been obtained on transistors with the layer structure shown in FIG. 1. FIG. 3 shows the influence of the fabrication method for the first layer 11, the second layer and the third layer 13 on the charge carrier concentration $n_s$. FIG. 3 shows the charge carrier concentration $n_s$ on the ordinate and the aluminum content x in atom % on the abscissa. The measured values shown in FIG. 3 have been recorded by means of a Hall effect measurement without a fourth layer 15 having been arranged on the surface 16 of the third layer 13. In this case, the values for semiconductor structures fabricated by means of molecular beam epitaxy are shown as circles. The filled squares represent measured values which have been recorded on semiconductor structures fabricated using MOVPE.

In addition, theoretically determined curves for the charge carrier density are plotted, which have been calculated on the basis of O. Ambacher et al.: Pyroelectric properties of AlGaN/GaN hetero- and quantum-well structures, J. Phys.: Condens. Matter 14 (2002) 3399. In this context, it is found that the charge carrier density $n_s$ within the 2-DEG is lower for semiconductor structures which have been obtained by means of MBE than charge carrier densities $n_s$ from comparable semiconductor structures which have been fabricated by means of MOVPE. In accordance with the invention, it has been recognized that this difference in the charge carrier density $n_s$ can be attributed to a difference in the surface potential of the third layer 13. The surface potential $\Phi_B$ is accordingly 0.61 eV for the semiconductor structures fabricated by means of MBE and 0.26 eV for semiconductor structures fabricated by means of MOVPE.

Figure 4:
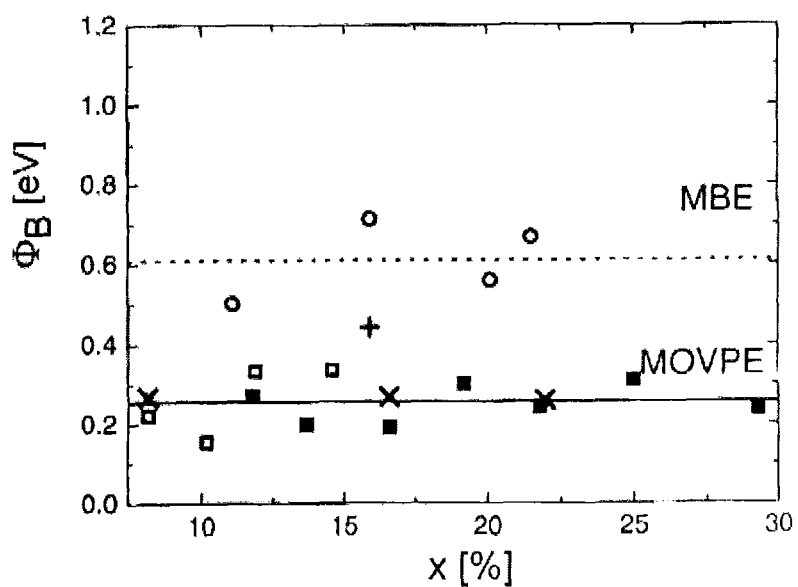
FIG. 4 discloses the surface potential $\Phi_B$ of the semiconductor structure as a function of the fabrication method and the aluminum content x of the second layer.

The influence of the fabrication method on the surface potential $\Phi_B$ is also shown in FIG. 4. FIG. 4 again shows the aluminum content x on the abscissa and the surface potential $\Phi_B$ on the ordinate. In this case, the filled squares again denote measured values which have been obtained by means of Hall effect measurements on semiconductor structures which have been fabricated by means of MOVPE. The circles denote measured values for the surface potential which have been obtained by means of Hall effect measurements on semiconductor structures which have been fabricated by means of MBE. Values of the surface potential which have been ascertained by means of CV profiles for semiconductor structures which have been fabricated by means of MOVPE are shown by unfilled squares. In addition, FIG. 4 shows results from measurements for the photoreflection as crosses. In this case, the values ascertained on semiconductor structures which have been fabricated by means of MOVPE are shown by rotated crosses.

Hence, the measured values shown in FIG. 4 also confirm that the surface potential $\Phi_B$ of the semiconductor structures is dependent on the fabrication method used. As a result, the fabrication method influences the measured charge carrier concentration $n_s$ so long as no gate material has been applied as a fourth layer 14 to the surface 16.

Figure 5:
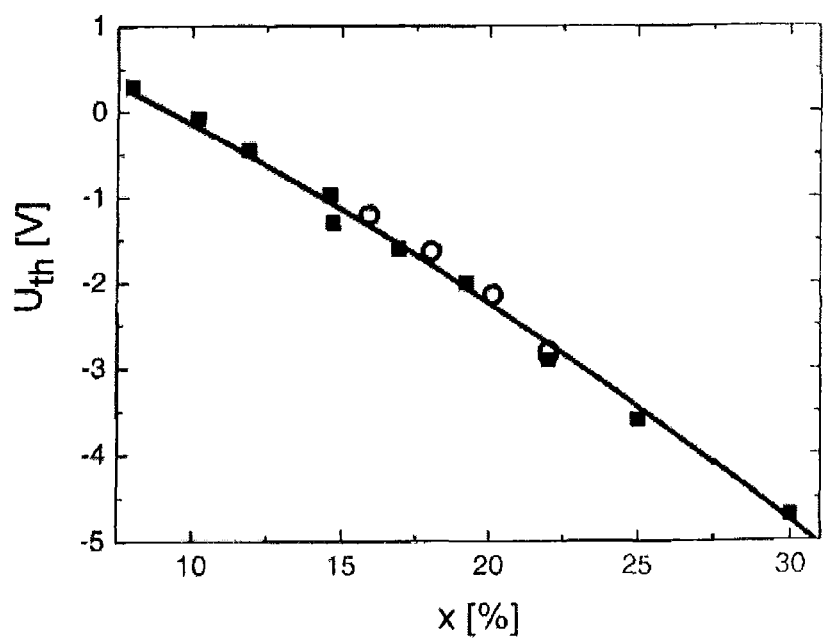
FIG. 5 shows the threshold voltage $U_{th}$ as a function of the aluminum content x for various embodiments of the present invention.

FIG. 5 shows the threshold voltage $U_{th}$ of a transistor which comprises the semiconductor structure shown in FIG. 1. As a departure from the semiconductor structures which have been used for the measurements shown in FIGS. 3 and 4, the semiconductor structures used for the measurements in FIG. 5 have the fourth layer 14—shown in FIG. 1—as a gate electrode.

FIG. 5 again shows the measured values obtained on semiconductor structures which have been fabricated by means of MOVPE as squares and the measured values from the semiconductor structures which have been fabricated by means of MBE as circles. FIG. 5 reveals that the threshold voltage $U_{th}$ and hence also the charge carrier density $n_s$ becomes independent of the fabrication method used for fabricating the semiconductor structure by virtue of the application of the fourth layer 14. This means that the surface potential $\Phi_B$ on the surface 16 is confined to the value of the Schottky barrier between the fourth layer 14 and the third layer 13 by virtue of the application of the fourth layer 14. According to the invention, it has been recognized that the threshold voltage $U_{th}$ of a transistor 1 and also the charge carrier density $n_s$ thereof are stipulated only by the combination of the first layer 11, the second layer 12, the third layer 13 and the fourth layer 14. If the process control involves measurements for the charge carrier density $n_s$ and/or for the threshold voltage $U_{th}$ being performed on the first layer 11, the second layer 12 and the third layer 13, these results are dependent on the surface potential of the third layer 13 and hence on the fabrication method, however.

In one exemplary embodiment, a power amplifier for a radio-frequency signal needs to be produced. Such a power amplifier can be used in a base station in a mobile radio network, for example. The power amplifier needs to be operated at an operating voltage of 50 V. The power amplifier comprises a plurality of transistors arranged in parallel which each have a design as shown in FIG. 1. The plurality of transistors may comprise between 80 and 120 transistors, for example. In one embodiment of the invention, the plurality of transistors may be monolithically integrated on a single substrate 10a. The distance between the individual transistors may be between approximately 50 µm and approximately 150 µm. This results in a gate width for the arrangement of between approximately 25 mm and approximately 40 mm. The gate length of the transistors may be between approximately 0.4 µm and approximately 1.0 µm.

The power amplifier takes the normal direct current and produces a radio-frequency output signal. In this context, a radio-frequency output signal within the meaning of the present invention is understood to be an output signal which has a frequency of more than 0.85 GHz, or a frequency of more than 2 GHz, or a frequency of more than 5 GHz. The portion of the direct current drawn which is not converted into the radio-frequency output signal by the power amplifier is converted into power loss $p_v$ and must be dissipated as heat. In some exemplary embodiments, the electrical power converted by the power amplifier may be more than 5 W, more than 10 W or more than 30 W.

Figure 6:
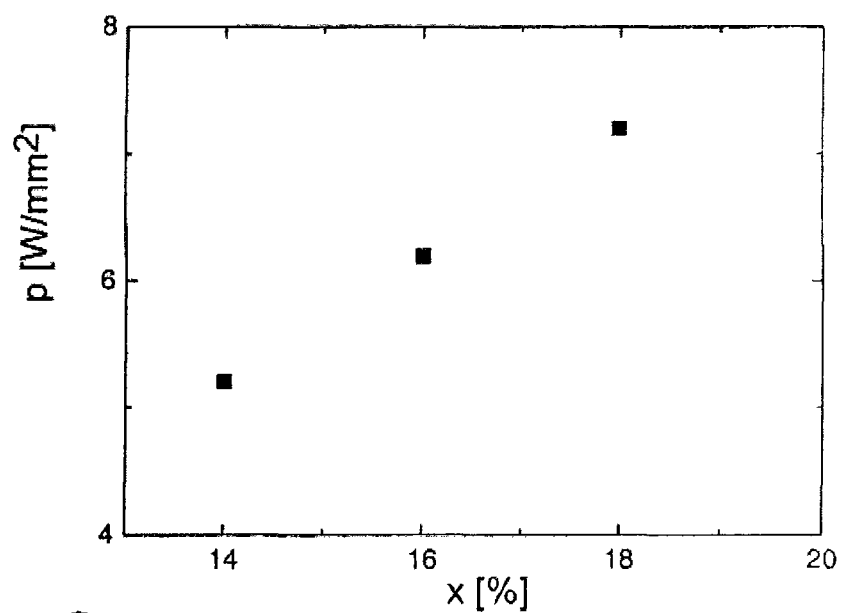
FIG. 6 shows the power density p of a plurality of transistors arranged in parallel for three different embodiments of the invention.

As FIG. 6 shows, the charge carrier concentration $n_s$ and hence the power density p rise as the aluminum content x of the second layer increases. In order to limit the thermal load, a low aluminum content x is therefore advantageous. On the basis of the relationship explained in method step 57 as shown in FIG. 2, this causes the threshold voltage $U_{th}$ to rise, however, and said threshold voltage can assume undesirably high values.

Figure 9:
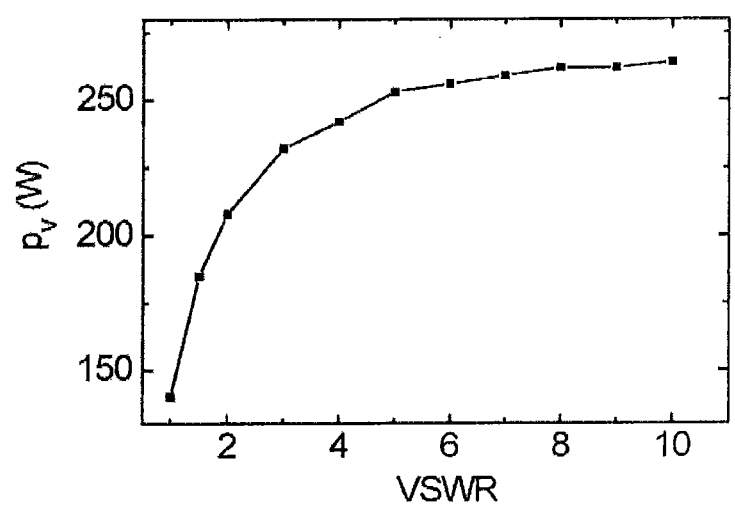
FIG. 9 shows the power loss $p_v$ for a plurality of transistors arranged in parallel according to the present invention for different voltage standing wave ratios VSWR.

FIG. 9 shows the power loss $p_v$ in a plurality of transistors arranged in parallel according to the present invention for different voltage standing wave ratios VSWR. The plurality of transistors may have a design as described in connection with FIG. 5. In this case, the voltage standing wave ratio VSWR is a measure of the mismatch between the transistors and the component connected to the respective outputs. A VSWR of 1:1 means that there is no mismatch in this case and the power loss and hence the generation of heat are minimal. As the VSWR increases, for example to values of 2:1, 3:1, 4:1, 5:1, 6:1 or 10:1, the mismatch increases and an ever greater component of the electrical power drawn is converted into power loss $p_v$, which can damage the semiconductor element.

As can be seen from FIG. 9, a semiconductor element which has been optimized using the method according to the invention can be operated at an operating voltage $V_{DS}$ of 50 V even with a large mismatch or with a VSWR of 10:1, although this causes the power loss to increase by a factor of between 1.5 and 2.0 in comparison with regular operation at a VSWR of 1:1. This allows an improvement in the reliability of the semiconductor element and of an appliance equipped with the element. In this case, the measured values shown in FIG. 9 have been recorded at an operating point of the transistor at which the transistor is in gain compression. In some embodiments of the invention, this may be the P3db point. In another embodiment of the invention, the transistor may be at the P1db point.

Figure 7:
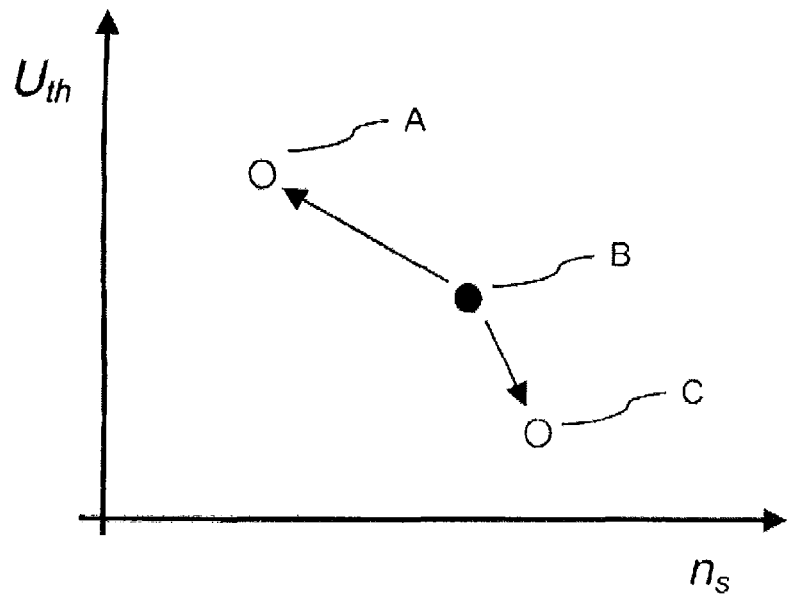
FIG. 7 schematically illustrates the alteration in the threshold voltage $U_{th}$ and in the charge carrier density $n_s$ in the event of an alteration in the aluminum content x and/or the layer thickness d.

FIG. 7 schematically explains the relationship between the threshold voltage $U_{th}$ on the ordinate and the charge carrier density $n_s$ on the abscissa for various values of the aluminum content and of the layer thickness d of the second layer 12 and of the third layer 13. By way of example, the point A in FIG. 7 represents a semiconductor structure with an aluminum content of x=0.14 and a layer thickness d=22 nm.

Starting at A, the point B can be reached by increasing the aluminum content to x=0.18 for an unaltered layer thickness d=22 nm. The semiconductor structure B is distinguished in that the threshold voltage $U_{th}$ falls, with a simultaneous rise in the charge carrier concentration $n_s$.

By increasing the thickness to d=30 nm for an unaltered aluminum content x=0.18, the point C is reached. The point C describes a semiconductor structure with a further-reduced threshold voltage $U_{th}$ for a slightly higher charge carrier density $n_s$. In particular, it should be pointed out that an alteration in the layer thickness d cannot be compensated for by an alteration in the aluminum content x. In this way, appropriate choice of the layer thickness d and the aluminum content x allow the simultaneous implementation of a low charge carrier density $n_s$ and a sufficiently low threshold voltage $U_{th}$, as explained in more detail in connection with FIG. 8.

Figure 8:
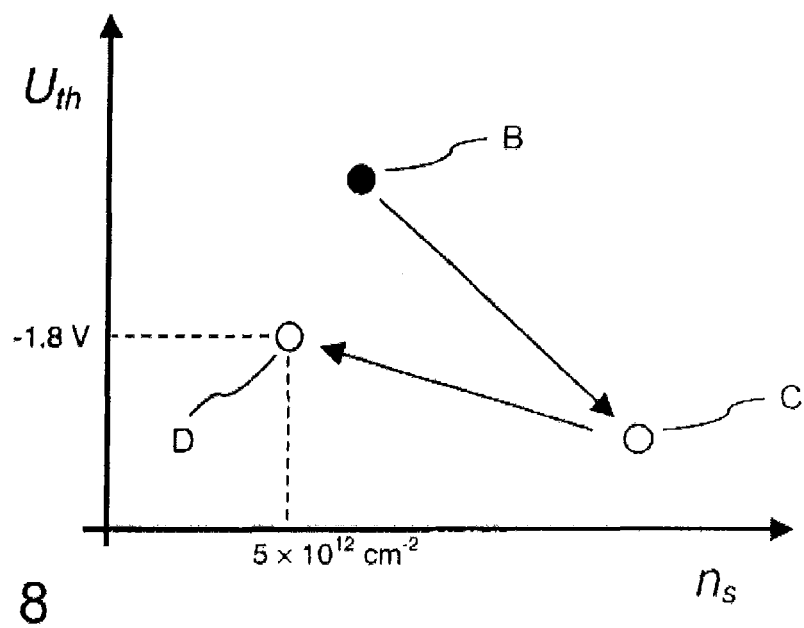
FIG. 8 schematically illustrates how by varying the layer thickness d and the aluminum content x it is possible to fabricate a transistor having prescribable values for the threshold voltage $U_{th}$ and the charge carrier density $n_s$.

According to FIG. 8, a transistor 1 having a threshold voltage $U_{th}$ of $-1.8$ V and a charge carrier density $n_s$ of $5\times10^{12}$ cm$^{-2}$ is intended to be fabricated. The transistor 1 having the desired, properties is denoted by the point D in FIG. 8.

Starting at point B with an aluminum content of x=18% and a layer thickness d=22 nm, the layer thickness is first of all increased to d=30 nm for an unaltered aluminum content of x=0.18. In this way, a semiconductor structure is obtained, the properties of which are denoted by C in FIG. 8.

The semiconductor structure C has a threshold voltage which is below the threshold voltage of $-1.8$ V. In addition, the charge carrier density $n_s$ and hence the power loss of the transistor are greater than the desired target value.

By reducing the aluminum content to x=0.12 for an unaltered layer thickness of d=30 nm, a severe reduction in the charge carrier density $n_s$ is obtained for a simultaneously only moderate rise in the threshold voltage $U_{th}$. In this way, it is possible to obtain the desired properties of the transistor 1 which are shown at point D. In this case, it should be pointed out that the threshold voltage $U_{th}$ is first stipulated by the selection of the gate metal, as described above in connection with FIG. 2. According to the invention, it is accordingly possible to fabricate transistors having the desired properties by selecting the layer thickness d, the aluminum content x and the gate material.

Self-evidently, the solution principle disclosed in the description above can also be used to optimize other parameters of a transistor. The above description should therefore be regarded not as limiting but rather as explanatory. The claims which follow should be understood to mean that a cited feature is present in at least one embodiment of the invention. This does not preclude the presence of further features. Where the claims and the description define "first", "second", "third" and "fourth" features, this designation is used to distinguish features of the same kind, without stipulating an order of rank.

The invention claimed is:

1. A method for determining a structure of a transistor, the method comprising:
    fabricating a first layer and a second layer of the transistor, wherein the second layer has a thickness d and an aluminum content x, the second layer is arranged on the first layer, the first layer comprises GaN, and the second layer comprises $Al_xGa_{1-x}N$;
    measuring a surface potential $\Phi_B$ of the first layer, a charge carrier density $n_s$, and a charge carrier mobility $\mu$ prior to application of a third layer to the transistor; and
    selecting, prior to application of the third layer to the transistor, material of the third layer based on a calculation that indicates a threshold voltage $U_{th}$ of the transistor with the third layer applied is a target threshold voltage, the calculation based on the surface potential $\Phi_B$ and the charge carrier density $n_s$ measured prior to application of the third layer to the transistor, wherein the selected material is a metal or an alloy.

2. The method according to claim 1, wherein the material of the third layer is selected from silver and/or palladium and/or nickel and/or platinum.

3. The method according to claim 1, wherein the transistor comprises further a fourth layer which comprises GaN and which is arranged between the second layer and the third layer, wherein the third layer is arranged on the fourth layer, the fourth layer is arranged on the second layer and the second layer is arranged on the first layer.

4. The method according to claim 1, wherein the total thickness d of the second layer is selected from approximately 15 nm and approximately 50 nm.

5. The method according to claim 1, wherein the aluminum content x is selected from 0.08 and 0.18.

6. The method according to claim 1, wherein the thickness of the second layer is increased in order to lower the threshold voltage $U_{th}$ of the transistor, and the thickness of the second layer is reduced in order to raise the threshold voltage $U_{th}$ of the transistor.

7. The method according to claim 1, wherein the aluminum content x of the second layer is increased in order to lower the threshold voltage $U_{th}$ of the transistor or to raise the charge carrier density $n_s$, and the aluminum content x of the second layer is reduced in order to raise the threshold voltage $U_{th}$ of the transistor or to lower the charge carrier density $n_s$.

8. The method according to claim 1, wherein the selection of the material of the third layer is made such that the threshold voltage $U_{th}$ of the transistor is between $-4.5$ V and $-1.0$ V.

9. The method according to claim 1, wherein a Hall effect measurement and/or a measurement of the photoreflection are performed.

10. The method according to claim 1, wherein a relationship between a change $\Delta\Phi_B$ in the surface potential as a result of the application of the third layer and a change $\Delta n_s$ in the charge carrier density is modeled by the following equation:

$$\Delta\Phi_B = \frac{e^2 \cdot d}{\varepsilon \cdot \varepsilon_0}\Delta n_s.$$

11. The method according to claim 10, wherein the threshold voltage $U_{th}$ is determined on the basis of the change in the surface potential $\Delta\Phi_B$ following the application of the third layer as follows:

$$U_{th} = U_{th}^0 + \frac{2 \cdot \Delta\Phi_B}{e}.$$

12. The method according to claim 1, wherein the threshold voltage $U_{th}$ is modeled on the basis of the surface potential $\Phi_B$ following the application of the third layer and the charge carrier density $n_s$ as follows:

$$U_{th} = \frac{\Phi_B}{e} - \frac{\Delta E_c}{e} - \frac{e \cdot n_s \cdot d}{\varepsilon \cdot \varepsilon_0}.$$

13. The method of claim 1 further comprising applying the third layer of the selected material to the transistor.

14. A method for determining a structure of a transistor, the method comprising:

fabricating a first layer and a second layer of the transistor, the second layer arranged on the first layer, the first layer comprising GaN, the second layer comprising $Al_xGa_{1-x}N$;

measuring a surface potential $\Phi_B$ of the first layer and a charge carrier density $n_s$ of the transistor prior to application of a third layer to the transistor; and selecting, prior to application of the third layer to the transistor, material of the third layer according to a calculation that indicates a threshold voltage $U_{th}$ of the transistor with the third layer of the selected material applied to the transistor is a target threshold voltage, the calculation based on the surface potential $\Phi_B$ and the charge carrier density $n_s$ measured after the first and second layers are fabricated but before the third layer is applied to the transistor, wherein the selected material comprises a metal or an alloy, and wherein the method further comprises at least one of:

increasing or decreasing a thickness of the second layer prior to application of the third layer to the transistor in order to lower or increase, respectively, the threshold voltage $U_{th}$ in the calculation; or increasing the aluminum content x of the second layer in order to lower the threshold voltage $U_{th}$ in the calculation or to raise the charge carrier density $n_s$ measured for the calculation or reducing the aluminum content x of the second layer in order to raise the threshold voltage $U_{th}$ in the calculation or to lower the charge carrier density $n_s$ measured for the calculation.

15. The method according to claim 14, wherein the aluminum content x is selected from 0.08 and 0.18.

16. The method according to claim 14, wherein a Hall effect measurement and/or a measurement of the photoreflection are performed.

17. The method according to claim 14, wherein a relationship between a change $\Delta\Phi_B$ in the surface potential as a result of the application of the third layer and a change $\Delta n_s$ in the charge carrier density is modeled by the following equation:

$$\Delta\Phi_B = \frac{e^2 \cdot d}{\varepsilon \cdot \varepsilon_0} \Delta n_s.$$

18. The method according to claim 17, wherein the threshold voltage $U_{th}$ is determined on the basis of the change in the surface potential $\Delta\Phi_B$ following the application of the third layer as follows:

$$U_{th} = U_{th}^0 + \frac{2 \cdot \Delta\Phi_B}{e}.$$

19. The method according to claim 14, wherein the threshold voltage $U_{th}$ is modeled on the basis of the surface potential $\Phi_B$ following the application of the third layer and the charge carrier density $n_s$ as follows:

$$U_{th} = \frac{\Phi_B}{e} - \frac{\Delta E_c}{e} - \frac{e \cdot n_s \cdot d}{\varepsilon \cdot \varepsilon_0}.$$

20. A semiconductor device comprising a transistor which comprises a first layer, a second layer and a third layer, wherein the third layer is arranged on the second layer and the second layer is arranged on the first layer, the first layer comprises GaN, the second layer comprises $Al_xGa_{1-x}N$ and the third layer comprises a metal or an alloy, wherein the aluminum content x is selected from 0.08 and 0.18, and wherein the transistor is configured to produce a radio-frequency output signal from a direct current, wherein the transistor is configured to operate at an electrical voltage $V_{DS}$ of more than 30 V between its drain and source electrodes and at a voltage standing wave ratio VSWR of more than 2:1.

21. The semiconductor device according to claim 20, wherein the transistor comprises further a fourth layer which comprises GaN and which is arranged between the second layer and the third layer, wherein the third layer is arranged on the fourth layer, the fourth layer is arranged on the second layer and the second layer is arranged on the first layer.

22. The semiconductor device according to claim 20, wherein the total thickness d of the second and third layers is selected from approximately 15 nm to approximately 50 nm.

23. The semiconductor device according to claim 20, wherein the aluminum content x is selected from 0.08 to 0.18.

24. The semiconductor device according to claim 20, wherein the material of the third layer comprises silver and/or palladium and/or nickel and/or platinum.

* * * * *